(12) United States Patent
Kurokawa

(10) Patent No.: US 9,276,577 B2
(45) Date of Patent: Mar. 1, 2016

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 56 days.

(21) Appl. No.: 14/315,624

(22) Filed: Jun. 26, 2014

(65) Prior Publication Data

US 2015/0008958 A1    Jan. 8, 2015

(30) Foreign Application Priority Data

Jul. 5, 2013    (JP) .................................. 2013-141214

(51) Int. Cl.
*H03K 19/0185* (2006.01)
*G09G 3/36* (2006.01)

(52) U.S. Cl.
CPC ...... *H03K 19/018521* (2013.01); *G09G 3/3659* (2013.01); *H03K 19/018585* (2013.01); *G09G 2300/0426* (2013.01)

(58) Field of Classification Search
CPC .......... H03K 19/0013; H03K 19/1776; H03K 19/17748; H03K 19/177; H03K 19/094; H03K 19/17736; H03K 19/0008; H03K 19/017581; H03K 19/018585; H03K 19/17728; H03K 19/003; H03K 19/1736; H03K 3/012; H03K 17/56; H03K 19/018521
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Alexander H Taningco
*Assistant Examiner* — Seokjin Kim
(74) *Attorney, Agent, or Firm* — Fish & Richardson P.C.

(57) ABSTRACT

Path transistor malfunction is reduced. A path gate circuit includes transistors MP, MW, and MC. The transistor MP functions as a path transistor that connects a signal line INL to a signal line OUTL. The transistor MW connects a signal line BL for inputting a signal for setting the on or off state of the transistor MP and a node SN (gate of the transistor MP). When a high-level potential is written to the node SN, the potential of BL is set higher than a normal high-level potential if the potential of INL is high. Thus, even when the potential of the node SN is dropped in accordance with transition of INL from a high level to a low level, the potential drop does not influence the operation of the transistor MP because a high potential is written in advance.

16 Claims, 9 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,547,753 B2 | 10/2013 | Takemura et al. |
| 8,675,382 B2 * | 3/2014 | Kurokawa ............ G11C 7/1006 365/189.09 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0285697 A1 | 10/2013 | Kurokawa |
| 2013/0293263 A1 * | 11/2013 | Kurokawa ............ H03K 19/094 326/41 |
| 2013/0314124 A1 | 11/2013 | Ikeda et al. |
| 2013/0321025 A1 | 12/2013 | Kurokawa et al. |
| 2014/0021980 A1 | 1/2014 | Takemura et al. |
| 2014/0119092 A1 | 5/2014 | Kurokawa |
| 2014/0266301 A1 * | 9/2014 | Kurokawa ........ H03K 19/17748 326/39 |
| 2014/0285235 A1 | 9/2014 | Kurokawa |
| 2014/0340116 A1 * | 11/2014 | Okamoto ............. H03K 19/177 326/41 |
| 2015/0123684 A1 * | 5/2015 | Kurokawa ........... G01R 31/2884 324/750.3 |
| 2015/0188520 A1 * | 7/2015 | Aoki ...................... H03K 17/56 327/109 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-172214 A | 9/2011 |
| JP | 2012-186797 A | 9/2012 |
| WO | WO-2004/114391 | 12/2004 |

OTHER PUBLICATIONS

Asaoka.Y et al., "29.1:Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing $MOO_3$ as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas". 214th ECS Meeting, 2008, No. 2317, ECS.

Kimizuka.N. et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, $In_2O_3(ZnO)m$ (m=3, 4, and 5), $InGaO_3$ $(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3$ $(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs with a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display with Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 3A
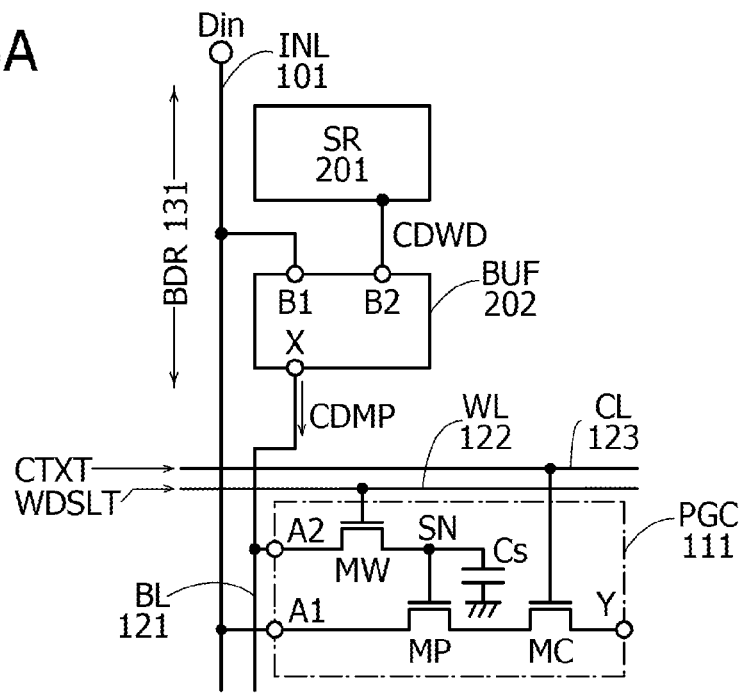
FIG. 3B
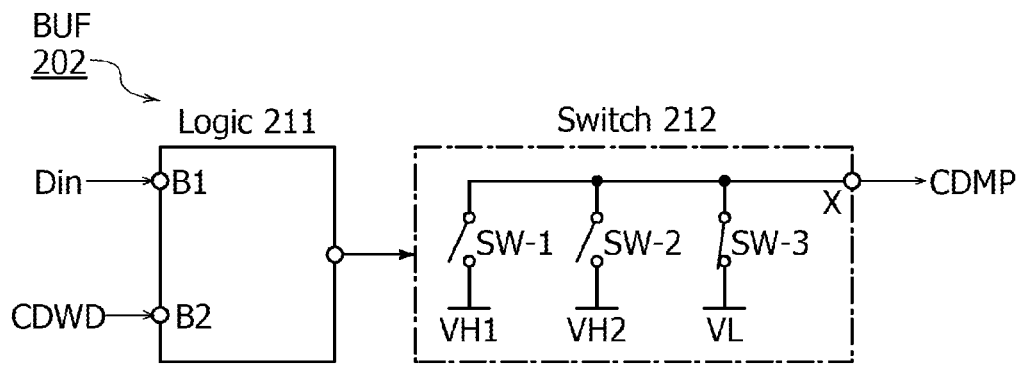
FIG. 3C
| B1 | B2 | SW-1 | SW-2 | SW-3 | X |
|---|---|---|---|---|---|
| L<br>H | L | OFF | OFF | ON | L |
| L | H | ON | OFF | OFF | H(VH1) |
| H | H | OFF | ON | OFF | H(VH2) |

| B1 | B2 | NG1 | NG2 | NG3 | X |
|----|----|-----|-----|-----|---|
| L  | L  | H2  | H2  | H   | L |
| H  | L  | H2  | H2  | H   | L |
| L  | H  | L   | H2  | L   | H |
| H  | H  | H2  | L   | L   | H2 |

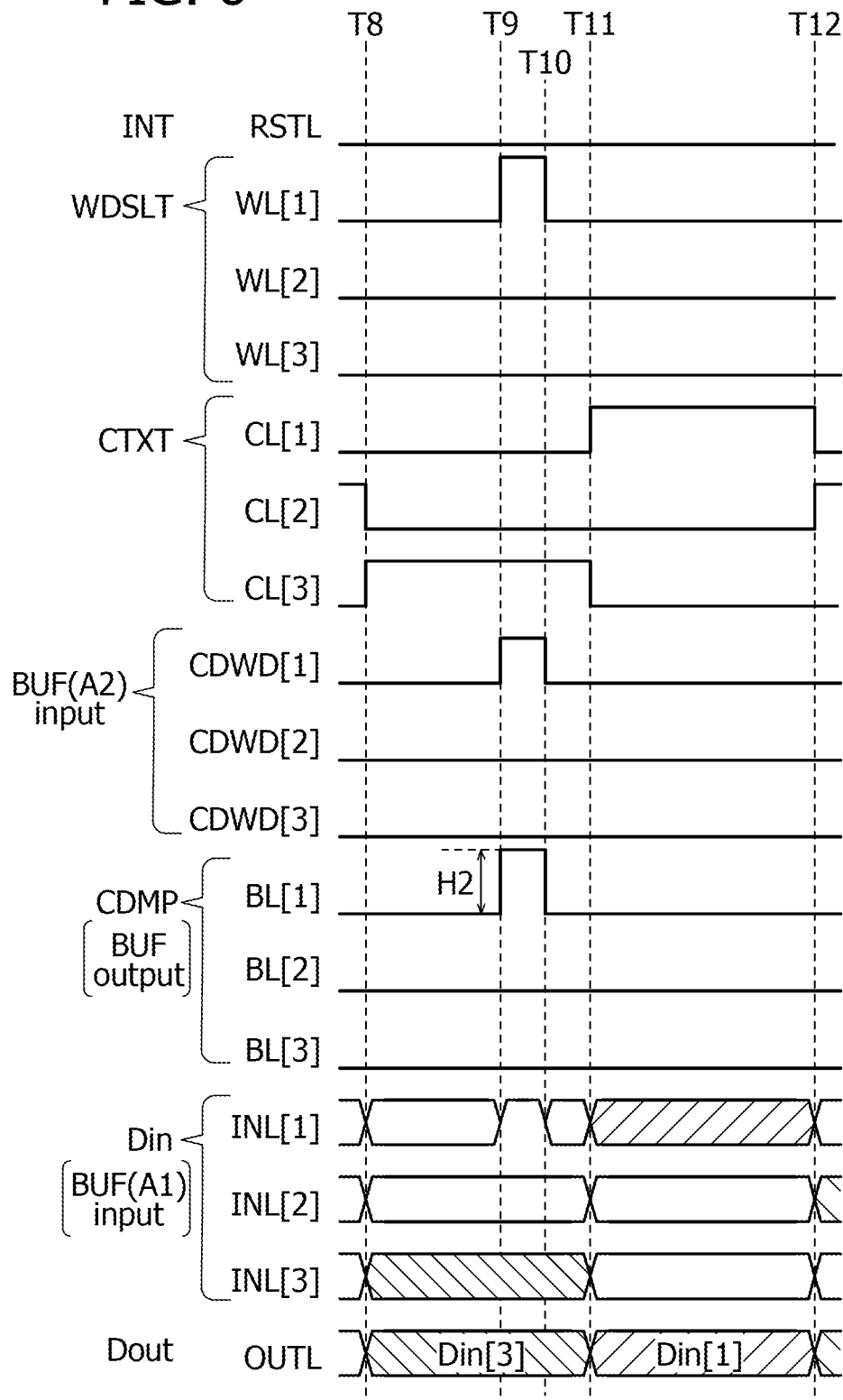

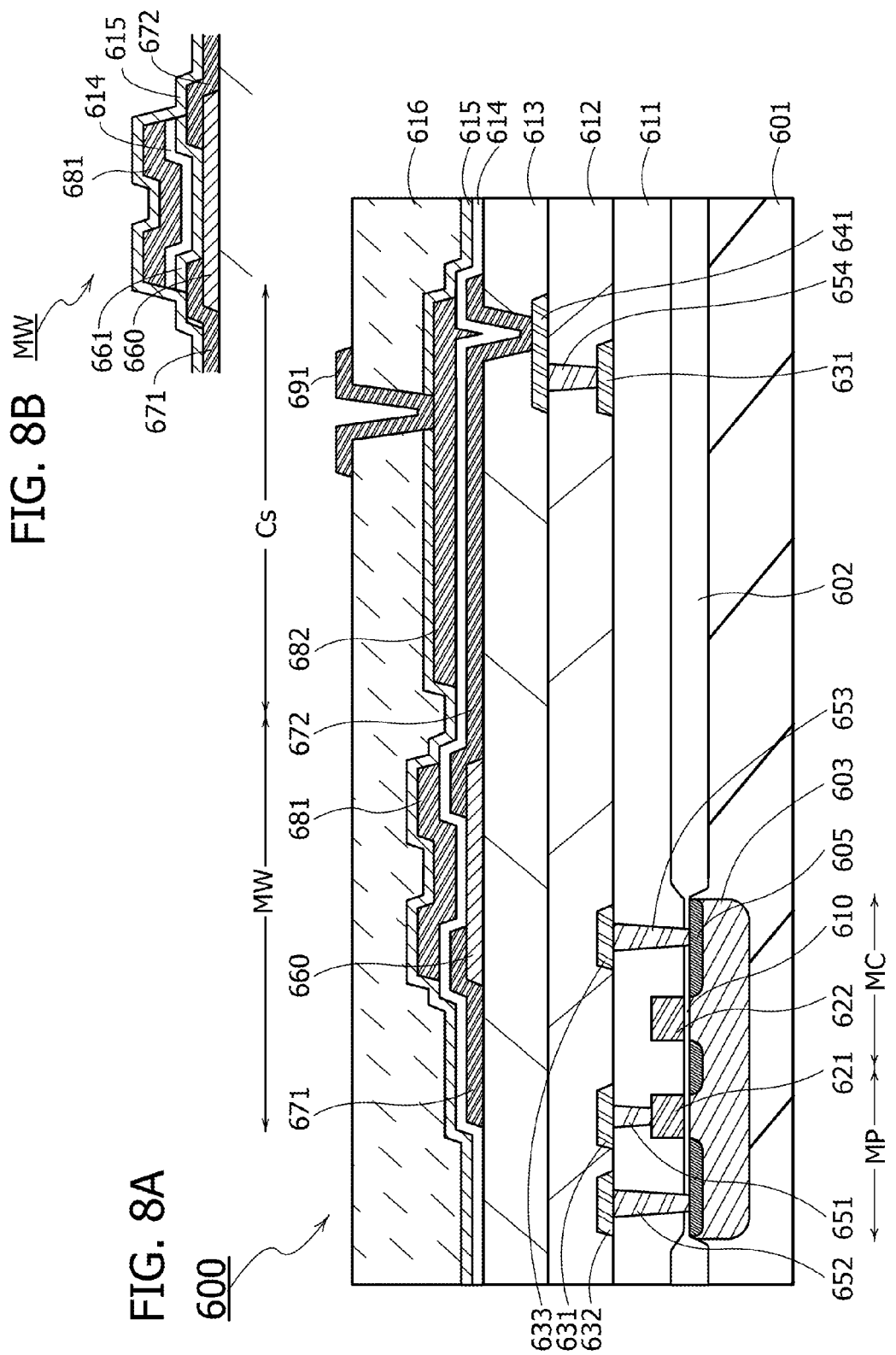

SEMICONDUCTOR DEVICE

BACKGROUND OF THE INVENTION

1. Field of the Invention

In this specification, a semiconductor device, a method for driving the semiconductor device, and a method for manufacturing the semiconductor device are described.

Note that in this specification, a semiconductor device means a circuit including a semiconductor element (e.g., a transistor or a diode). The semiconductor device also means any device that can function by utilizing semiconductor characteristics. For example, an integrated circuit, a chip including an integrated circuit, a display device, a light-emitting device, and an electronic device are all semiconductor devices.

2. Description of the Related Art

A programmable logic device (PLD) is a kind of large integrated circuit (LSI), and is an integrated circuit whose internal circuit structure can be changed by a user with programming after shipment.

Fundamental components of the PLD are a plurality of logic elements that execute logical operation and wirings that connect the logic elements to each other. The function of the PLD is changed by changing the function of each logic element and connection between the logic elements.

For example, a programmable switch circuit in which a path transistor is combined with a memory storing data for setting the on or off state of the path transistor is known as a switch that connects logic elements to each other. By rewriting data for setting the on or off state of the path transistor, connection between the logic elements can be changed.

Data for setting the structure of the PLD is referred to as configuration data. A memory storing configuration data is referred to as a configuration memory.

In addition, it is known that a transistor including an oxide semiconductor has extremely low off-state current. For example, Patent Documents 1 and 2 disclose programmable switches each formed using a transistor including an oxide semiconductor. By using the transistor including an oxide semiconductor, unlike a DRAM, the gate potential of a path transistor can be held for a long period without refresh operation.

REFERENCE

Patent Document 1: Japanese Published Patent Application No. 2011-172214
Patent Document 2: Japanese Published Patent Application No. 2012-186797

SUMMARY OF THE INVENTION

Configuration data writing errors or retention errors lead to PLD malfunction.

In view of the problem, it is an object of one embodiment of the present invention to provide a semiconductor device that can operate stably and a method for driving the semiconductor device. It is an object of one embodiment of the present invention to provide a semiconductor device that has higher reliability and a method for driving the semiconductor device.

It is an object of one embodiment of the present invention to provide a semiconductor device that has a smaller number of data writing errors or retention errors and a method for driving the semiconductor device. It is an object of one embodiment of the present invention to provide a semiconductor device that can perform context switch stably and a method for driving the semiconductor device.

Note that the description of a plurality of objects does not disturb the existence of each object. One embodiment of the present invention does not necessarily achieve all the objects. Other objects will be apparent from and can be derived from the description of the specification and the like.

One embodiment of the present invention is a semiconductor device that includes a first transistor controlling connection between a first signal line and a second signal line; a third signal line supplying a first signal for setting the on or off state of the first transistor; a second transistor controlling connection between the third signal line and a gate of the first transistor; and a circuit generating the first signal. When the circuit generates the high-level first signal, the first signal is set at a first high level in the case where the potential of the first signal line is low, and the first signal is set at a second high level that is higher than the first high level in the case where the potential of the first signal line is high.

One embodiment of the present invention is a semiconductor device that includes first to third signal lines; a first transistor controlling connection between the first signal line and the second signal line; a second transistor controlling connection between the third signal line, the first signal line, and a gate of the first transistor; and a circuit whose output terminal is connected to the third signal line. The circuit includes a first input terminal to which a first signal is input from the first signal line; a second input terminal to which a second signal for setting the gate potential level of the first transistor; a first switch that connects the output terminal to a first potential supply line supplying a first potential; a second switch that connects the output terminal to a second potential supply line supplying a second potential; a third switch that connects the output terminal to a third potential supply line supplying a third potential; and a control portion controlling the on or off state of each of the first to third switches. Each of the first and second potentials sets the potential of the output terminal high. The second potential is higher than the first potential. The third potential sets the potential of the output terminal low. In the case where the second signal is low, the control portion turns on the third switch and turns off the other switches. In the case where the second signal is high and the first signal is low, the control portion turns on the first switch and turns off the other switches. In the case where the second signal is high and the first signal is high, the control portion turns on the second switch and turns off the other switches.

According to one embodiment of the present invention, a semiconductor device that can operate stably and a method for driving the semiconductor device can be provided. Further, according to one embodiment of the present invention, a semiconductor device that has higher reliability and a method for driving the semiconductor device can be provided. Furthermore, according to one embodiment of the present invention, a semiconductor device that has a smaller number of data writing errors or retention errors and a method for driving the semiconductor device can be provided. Furthermore, according to one embodiment of the present invention, a semiconductor device that can perform context switch stably and a method for driving the semiconductor device can be provided.

BRIEF DESCRIPTION OF THE DRAWINGS

In the accompanying drawings.

FIG. 3A is a block diagram illustrating a structure example of a driver BDR, FIG. 3B is a block diagram illustrating a structure example of a buffer circuit BUF of BDR, and FIG. 3C is a truth table of BUF;

FIG. 6 is a timing chart showing an example of a method for driving CM-SW;

FIG. 8A is a cross-sectional view illustrating a device structure example of a PLD, and FIG. 8B is a cross-sectional view illustrating a structure example of a transistor.

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Embodiment 1

In this embodiment, a programmable logic device (PLD) is described as an example of a semiconductor device with reference to FIG. 1, FIG. 2, FIGS. 3A to 3C, FIGS. 4A and 4B, FIG. 5, FIG. 6, and FIGS. 7A and 7B.

Note that small-scale integrated circuits such as a programmable array logic (PAL) and a generic array logic (GAL) and large-scale integrated circuits such as a complex programmable logic device (CPLD) and a field programmable gate array (FPGA) are known as user-programmable devices. In this specification, programmable integrated circuits (including the integrated circuits) are called PLDs.

In this embodiment, a dynamically reconfigurable PLD is also described.

<Structure Example of Programmable Logic Device (PLD)>

Figure 1:
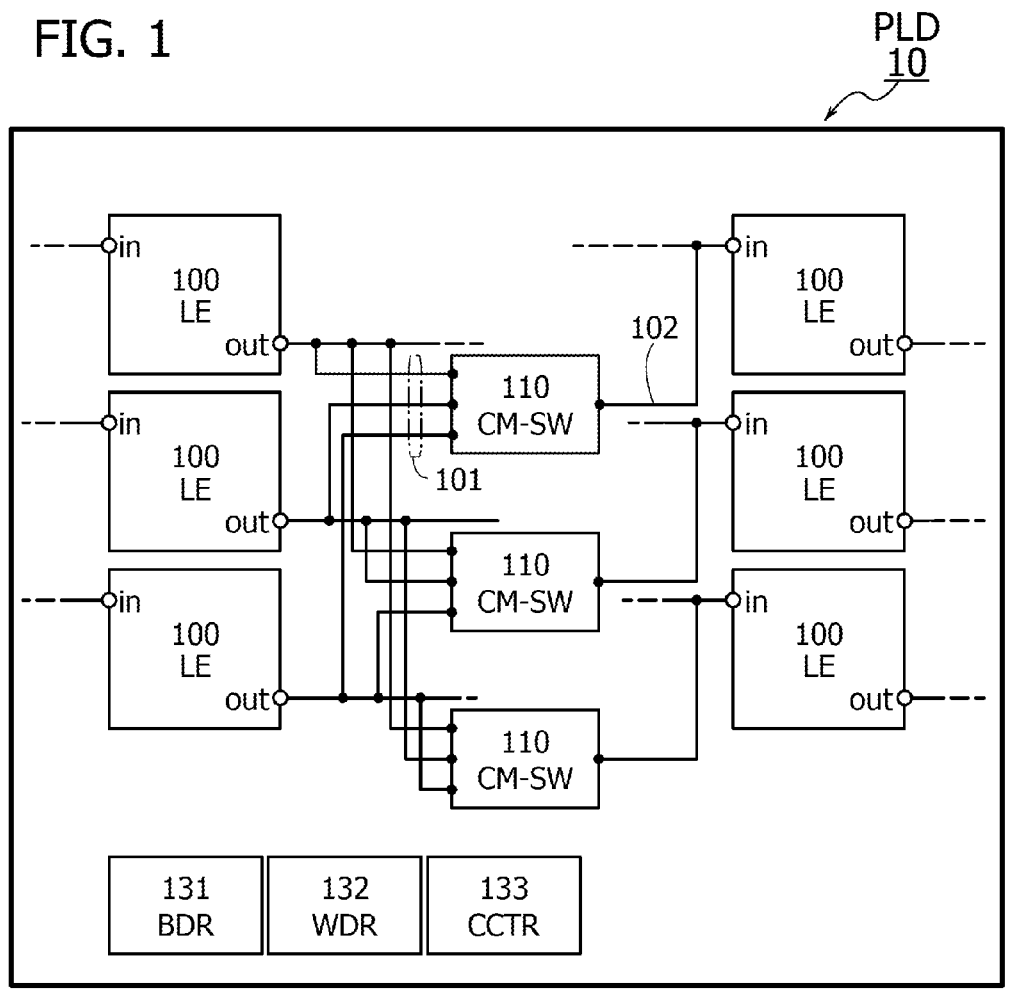
FIG. 1 is a block diagram illustrating a structure example of a programmable logic device (PLD)

FIG. 1 is a block diagram illustrating a structure example of a PLD.

A PLD 10 includes a plurality of logic elements LE 100 and a plurality of switch circuits CM-SW 110.

The LE 100 is a fundamental unit that executes fundamental logical operation for operating the PLD 10 and is also referred to as a processing element (PE).

The CM-SW 110 is a programmable switch circuit that functions as a switch connecting any one of a plurality of input signal lines 101 to an output signal line 102 and functions as a memory (configuration memory) storing configuration data for selecting the input signal line 101 connected to the output signal line 102. FIG. 1 illustrates an example in which the CM-SW 110 includes three input signal lines 101 and one output signal line 102. An output of the LE 100 is connected to the input signal line 101, and an input of the LE 100 is connected to the output signal line 102.

The CM-SW 110 can store a plurality of contexts (configuration data (group)). The data path of the LE 100 can be changed by context switch while the PLD 10 operates. In other words, the PLD 10 functions as a multi-context dynamically reconfigurable processor.

The PLD 10 further includes a driver BDR 131 and a driver WDR 132 generating control signals of the configuration memory of the CM-SW 110 and a controller CCTR 133 controlling the drivers 131 and 132.

The BDR 131 has functions of generating a signal CDMP corresponding to configuration data and outputting the signal CDMP to the CM-SW 110. As described later, the BDR 131 generates the signal CDMP based on a data signal input to the input signal line 101.

The WDR 132 has a function of generating a signal for selecting a memory cell to which configuration data is written. The CCTR 133 has a function of controlling operation of writing configuration data in the PLD 10.

Like the CM-SW 110, a multi-context configuration memory can be provided in the LE 100. Thus, the CM-SW 110 itself can be reconfigured while the PLD 10 operates. In that case, the configuration memory of the CM-SW 110 may also be controlled by the drivers 131 and 132 and the CCTR 133.

<Structure Example of Switch Circuit CM-SW 110>

Figure 2:
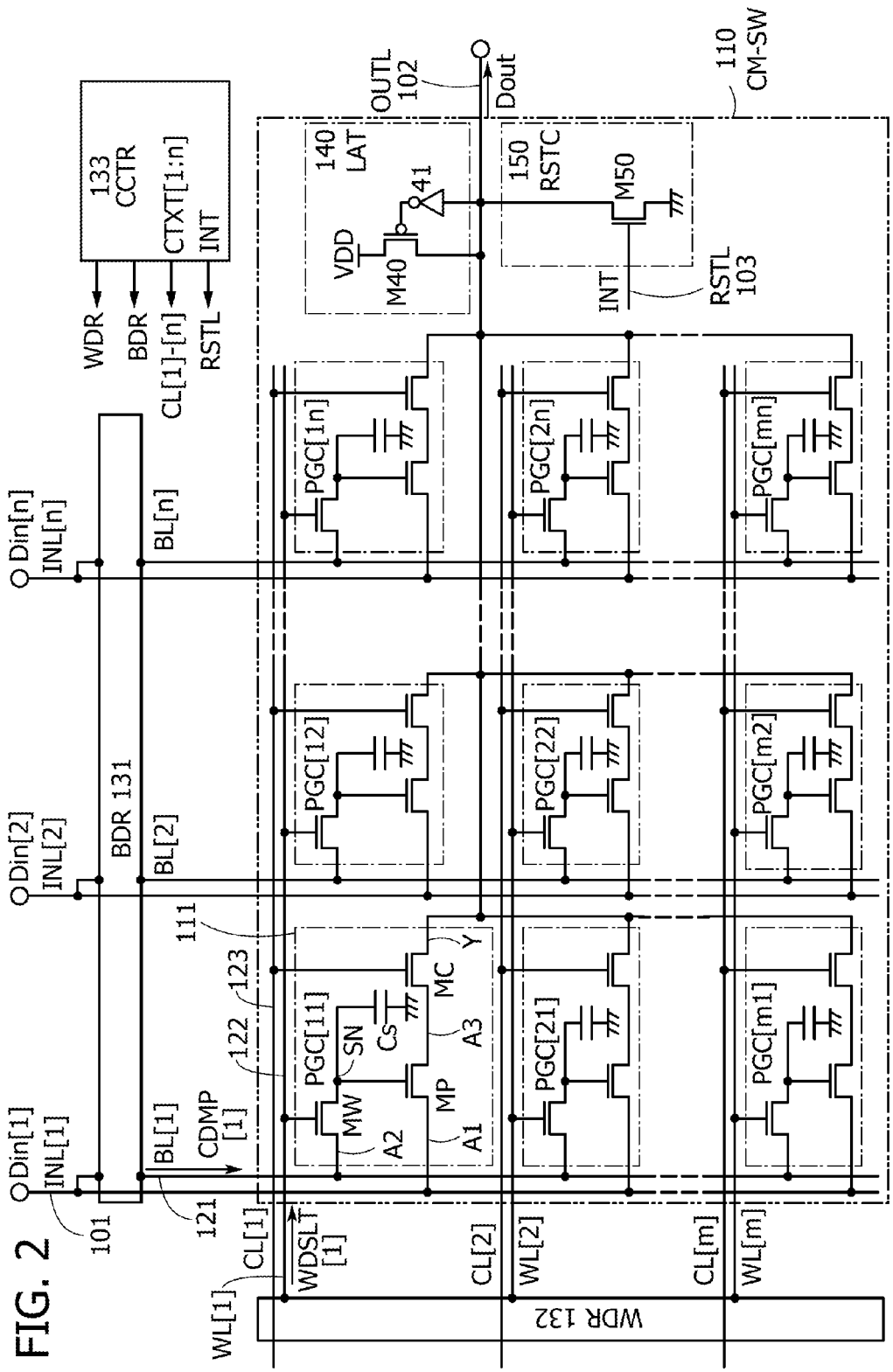
FIG. 2 is a circuit diagram illustrating a structure example of a switch circuit CM-SW that connects logic elements to each other.

FIG. 2 is a circuit diagram illustrating a structure example of the switch circuit CM-SW 110.

The switch circuit CM-SW 110 includes the plurality of input signal lines INL 101, one output signal line OUTL 102, a plurality of path gate circuits PGC 111, and a plurality of signal lines BL, WL, and CL for inputting control signals to the PGCs 111.

In the CM-SW 110, the PGCs 111 are arranged in an array of m rows and n columns (m and n are each an integer of 2 or more). In accordance with the arrangement of the PGCs 111, n input signal lines INL 101, n signal lines BL 121, m signal lines WL 122, and m signal lines CL 123 are provided. In the example of FIG. 2, the number of contexts in the CM-SW 110 is m. Here, the row number of the CM-SW 110 corresponds to the identification number of a context.

Note that in the following description, the input signal line 101 is also abbreviated as a signal line INL or INL. In addition, a symbol such as "[2]" is an identification number (arrangement number) for distinguishing the same components from each other. For example, the PGC 111 in a k-th row and a j-th column is also referred to as PGC[kj]. The same applies to the names of other signal lines, circuits, signals, potentials, and the like.

As described with reference to FIG. 1, outputs of the different LEs 100 are connected to n INLs 101 and data signals Din[1] to Din[n] are input from the LEs 100 to the n INLs 101. An input of the LE 100 is connected to the OUTL 102. A data signal Din[j] supplied from INL[j] connected by the CM-SW 110 is output to the OUTL 102 as a data signal Dout.

Note that the number of the INLs 101 can be one. In that case, in the CM-SW 110, m PGCs 111 are arranged in an array of m rows and one column.

The BL 121 is also referred to as a bit line. The BL 121 is connected to the driver BDR 131. The signal CDMP corresponding to configuration data is input to the BL 121 from the BDR 131. The BDR 131 has a function of generating the signal CDMP in accordance with configuration data input from the outside of the PLD 10.

The WL 122 is also referred to as a word line. The WL 122 is connected to the driver WDR 132. The WDR 132 generates a signal WDSLT for selecting the row number (address) of the PGC 111 to which configuration data is written and outputs the signal WDSLT to the WL 122.

The CCTR 133 controls configuration and outputs control signals to the BDR 131 and the WDR 132. The CCTR 133 generates a signal (context signal CTXT) for selecting a context and outputs the signal to the CL 123.

A latch circuit LAT 140 and a reset circuit RSTC 150 may be provided in the CM-SW 110.

The LAT 140 is connected to the OUTL 102 and has a function of keeping the potential level of the OUTL 102. The LAT 140 includes a transistor M40 and an inverter 41.

Note that a transistor is an element having three terminals: a gate, a source, and a drain. The functions of two terminals (i.e., the source and the drain (excluding the gate)) might interchange depending on the conductivity type (n-type or p-type) of the transistor and potentials input to the terminals. Here, for easy understanding of circuit operation, a terminal whose potential is lower than a gate potential when an n-channel transistor is on is referred to as a source, and a terminal whose potential is lower than a gate potential when a p-channel transistor is on is referred to as a drain. Thus, in principle, a terminal of an n-channel transistor to which a control signal or a ground potential (low power supply potential) is input is referred to as a source, and a terminal of the n-channel transistor to which a high power supply potential is input is referred to as a drain. The relationship between a source and a drain of a p-channel transistor is opposite to that of the n-channel transistor.

The OUTL 102 is connected to a gate of the transistor M40 through the inverter 41. The transistor M40 functions as a switch that connects the OUTL 102 to a wiring supplying a potential VDD. A source of the transistor M40 is connected to the wiring supplying VDD, and a drain of the transistor M40 is connected to the OUTL 102. The potential VDD is a high power supply potential for setting the potential of the OUTL 102 high. When the transistor M40 is turned on, the OUTL 102 is connected to the wiring supplying VDD and the potential of the OUTL 102 is set high.

The RSTC 150 is connected to the OUTL 102 and has a function of setting the potential of the OUTL 102 low. The RSTC 150 includes a transistor M50. The transistor M50 functions as a switch that connects a wiring supplying a ground potential GND to the OUTL 102. A source of the transistor M50 is connected to the wiring supplying GND, and a drain of the transistor M50 is connected to the OUTL 102. GND corresponds to a potential for setting the potentials of signal lines including the OUTL 102 low. A signal line RSTL 103 is connected to a gate of the transistor M50. A control signal (reset signal) NT is input from the CCTR 133 to the RSTL 103. When the transistor M50 is turned on by input of the signal NT, the potential of the OUTL 102 is set low. In other words, the signal NT can reset the potential of the OUTL 102 to a low level regardless of the circuit structure of the CM-SW 110.

<Structure Example of Path Gate Circuit PGC 111>

The PGC 111 is a fundamental element of the CM-SW 110. The PGC 111 is also a programmable switch circuit and a unit element (memory cell) of a storage portion of the configuration memory in the CM-SW 110.

The PGC 111 includes three transistors MW, MP, and MC and a capacitor Cs. Nodes A1 and A2 are input nodes, and a node Y is an output node. Nodes SN and A3 are a gate and a drain of the transistor MP, respectively.

The nodes A1 and A2 are connected to the INL 101 and the BL 121 in a corresponding column, respectively. The nodes Y of all the PGCs 111 are connected to the OUTL 102.

The transistor MP is a path transistor that constitutes a switch connecting the node A1 to the node Y. By setting the on or off state of the transistor MP, the INL 101 connected to the OUTL 102 is selected. The gate of the transistor MP is connected to the WL 122. A source of the transistor MP is connected to the node A1. The drain of the transistor MP is connected to a source of the transistor MC.

The signal CDMP input from the BDR 131 to the PGC 111 is a configuration data signal for setting the on or off state of the transistor MP. The signal CDMP is written to the node SN (gate of the transistor MP) and held in the node SN as a potential. The transistor MW functions as a switch that connects the node A2 to the node SN. A gate of the transistor MW is connected to the WL 122. A source of the transistor MW is connected to the node A2. A drain of the transistor MW is connected to the node SN.

The transistor MC functions as a switch for context switch and is connected to the transistor MP in series. A gate of the transistor MC is connected to the CL 123. The source of the transistor MC is connected to the drain of the transistor MP. A drain of the transistor MC is connected to the node Y.

The transistor MW and the capacitor Cs constitute a retention circuit that holds the potential of the node SN (gate of the transistor MP). The potential of the node SN corresponds to configuration data for setting the on or off state of the transistor MP. The CM-SW 110 is a switch circuit including a retention circuit that stores configuration data.

When the transistor MW is turned off, the node SN is set in an electrically floating state. Thus, when the transistor MW has extremely low off-state current, a fluctuation in potential of the node SN can be inhibited and configuration data can be stored in the node SN for a long time. Consequently, unlike a DRAM, the retention circuit (MP and Cs) can function as a nonvolatile memory that does not need frequent refresh operation.

One terminal (electrode) of the capacitor Cs is connected to the node SN, and the other terminal of the capacitor Cs is connected to a wiring to which a constant potential is supplied. Here, the other terminal of the capacitor Cs is connected to a wiring to which GND is supplied. Note that gate parasitic capacitance of the transistor MP can be used as the capacitor Cs instead of providing an element serving as the capacitor Cs.

Note that the off-state current of a transistor means current that flows between a source and a drain in an off state. To inhibit a fluctuation in potential of the node SN, the off-state current of the transistor MW is preferably as low as possible. Here, low off-state current means that normalized off-state current per micrometer of channel width at room temperature is lower than or equal to 10 zA ($10 \times 10^{-21}$ A). Since the off-state current is preferably as low as possible, the normalized off-state current of the transistor MW per micrometer of channel width is preferably lower than or equal to 1 zA, more preferably lower than or equal to 10 yA ($10 \times 10^{-24}$ A), still more preferably lower than or equal to 1 yA.

To reduce off-state current drastically in this manner, a channel formation region of the transistor MW is preferably formed using a semiconductor whose bandgap is wider than that of Si or Ge (3.0 eV or more). A typical example of such a wide gap semiconductor is an oxide semiconductor. Other examples are compound semiconductors such as silicon carbide (SiC) and gallium nitride (GaN).

Unlike silicon carbide or gallium nitride, the oxide semiconductor has an advantage of high mass productivity because the oxide semiconductor can be formed by sputtering or a wet process. In addition, a crystalline oxide semiconductor film can be formed even at the upper temperature limit of a glass substrate used as a backplane substrate of a liquid crystal panel. Thus, it is preferable to select a transistor whose channel formation region is formed using an oxide semiconductor as the transistor MW. Here, a transistor whose channel formation region is formed using an oxide semiconductor (OS) is referred to as an OS transistor.

An oxide semiconductor of an OS transistor preferably contains at least indium (In) or zinc (Zn). The oxide semiconductor preferably contains an element that functions as a stabilizer for reducing variations in electrical characteristics. Examples of such an element include Ga, Sn, Hf, Al, and Zr. Typical examples of the oxide semiconductor of the OS transistor include an In—Ga—Zn-based oxide and an In—Sn—Zn-based oxide.

Note that the OS transistor is described in detail in Embodiment 2.

<Example of Method for Driving Path Gate Circuit PGC>

An example of a method for driving the PGC 111 is described below.

When configuration data is written, the transistor MC is off.

In the case where configuration data for turning on the transistor MP is written, the node A2 is set at a high level. In the case where configuration data for turning off the transistor MP is written, the node A2 is set at a low level. After the node A2 is set at a predetermined potential, the transistor MW is turned on. Thus, the potential level of the node SN becomes equal to that of the node A2. In other words, the configuration data is written to the node SN.

By turning off the transistor MW, the node SN is set in an electrically floating state and the potential of the node SN is held. In other words, the PGC 111 retains the configuration data.

In the case where the PGC 111 functions as a switch, the transistor MW is turned off and the transistor MC is turned on. When the node SN is at a high level, the transistor MP is on; thus, the node A1 is connected to the node Y. In contrast, when the node SN is at a low level, the transistor MP is off; thus, the node A1 is not connected to the node Y.

When one row of the CM-SW 110 is selected by the control signal CTXT from the CCTR 133, context switch is performed. Specifically, for example, in the case where a k-th context (context[k]) is selected, the CL 123 (CL[k]) in the k-th row is set at a high level and the CLs 123 in the other rows are set at a low level. All the transistors MC that are connected to CL[k] are turned on, and PGCs[k1] to [kn] in the k-th row are selected (set in an active state). For example, in the case where configuration data for turning on the transistor MP is written to PGC[kj] in the j-th column, INL[j] is connected to the OUTL 102.

When configuration data is not written, in the PGC 111, the transistor MW is off and the node SN is electrically floating. Thus, it is possible to increase the switching speed of the transistor MP by boosting effect on the gate potential of the transistor MP.

In the case where the potential of the node SN is higher than the threshold voltage of the transistor MP, the transistor MP is on and the potential of the node SN is increased in accordance with the increase in potential of the node A1 because of capacitive coupling between the gate and the source of the transistor MP. This effect is called boosting effect.

The increase in potential of the node SN in accordance with the increase in potential of the node A1 (primary boosting effect) is caused by capacitive coupling between the gate and the source of the transistor MP. In accordance with the increase in potential of the node SN, the rise of a signal (potential) supplied to the node A3 is accelerated by capacitive coupling by between the gate and the drain of the transistor MP (secondary boosting effect).

In other words, in the PGC 111, by using the boosting effect actively, the potential of the floating node SN can be increased or decreased in accordance with transition of the potential level of the node A1; thus, the switching speed of the transistor MP can be increased. As capacitive coupling (e.g., gate-source capacitance) caused by the gate of the transistor MP becomes larger and another capacitance (e.g., the capacitor Cs) connected to the node SN becomes smaller, the boosting effect is increased.

Since the PGC 111 is a multi-context reconfigurable switch circuit, the configuration data of the PGC 111 can be rewritten while the PLD 10 operates. Specifically, configuration data of the PGCs 111 in a row that is not selected by the signal CTXT can be rewritten. Thus, writing overhead (time) of configuration data can be reduced. In addition, there is no restriction on the number of contexts; thus, flexibility in reconfiguring the PLD 10 can be increased, and the small-scale PLD 10 including a small number of LEs 100 can perform processing equivalent to that performed by a larger-scale processor.

While the PLD 10 operates, the INL 101 (node A1) is set at a high level in some cases. In the case where a high-level potential (configuration data for turning on the transistor MP) is written to the PGC 111 in which a high-level signal is supplied to the node A1, when the potential of the node SN is increased by the boosting effect, it might be impossible to write a potential for turning on the transistor MP to the node SN.

Furthermore, if the potential level of the node A1 is changed from a high level to a low level after a high-level potential is written to the node SN with the node A1 set at the high level, the potential of the node SN is decreased in accordance with the decrease in potential of the node A1 by the boosting effect; thus, it might be impossible to hold the potential for turning on the transistor MP.

As the capacitance of the capacitor Cs connected to the gate of the transistor MP becomes smaller to use the boosting effect or to achieve high integration, the amount of fluctuation in potential of the node SN due to the boosting effect becomes larger; thus, the problem of data writing errors or retention errors in the CM-SW 110 is actualized. These errors become causes of malfunction of the PLD 10.

Thus, to reduce the data writing errors or retention errors, the potential level of configuration data CDMP written to the CM-SW 110 is set in accordance with the potential level of the INL 101 (node A1). For example, a circuit for generating the signal CDMP is provided in the BDR 131, and the signal generation circuit generates the signal CDMP so that the signal CDMP has a potential level based on an input signal of the INL 101 and configuration data. Accordingly, writing errors or retention errors in configuration data due to a fluctuation in potential of the INL 101 can be reduced regardless of the presence or absence of the capacitor Cs or the capacitance of the capacitor Cs, so that stable context switch can be performed.

<Structure Example of Driver BDR>

The circuit for generating the signal CDMP can be embedded in a buffer circuit provided in an output stage of the BDR 131. The BDR 131 may include a shift register and/or a decoder in addition to a buffer circuit. Here, the BDR 131 includes n shift registers and a buffer circuit at an output of each shift register.

FIG. 3A illustrates a structure example of the BDR 131. Here, a circuit block of one shift register is illustrated. FIG. 3B is a block diagram illustrating a structure example of a buffer circuit BUF.

The BDR 131 includes n shift registers SR 201, and a BUF 202 is connected to an output of each shift register. An output of the BUF 202 is connected to the BDR 131.

The shift register 201 generates a signal CDWD in response to a control signal from the CCTR 133. The signal CDWD corresponds to configuration data written to the PGC 111. In the case where the transistor MP in the PGC 111 is turned on, CDWD is set high. In the case where the transistor MP in the PGC 111 is turned off, CDWD is set low. Here, the shift register 201 generates the signal CDWD; however, this embodiment is not limited thereto.

The INL 101 and an output terminal of the shift register 201 in a corresponding column (stage) are connected to input terminals B1 and B2 of the BUF 202, respectively. The BL 121 in the same column is connected to an output terminal X of the BUF 202. The BUF 202 generates the signal CDMP and outputs the signal CDMP to the BDR 131. The BUF 202 sets the potential level of the CDMP in accordance with the potential levels of the data signal Din input from the INL 101 and the configuration data signal CDWD input from the shift register 201.

<Structure Example of Buffer Circuit BUF>

As illustrated in FIG. 3B, for example, the BUF 202 can include a logic portion 211 and a switch portion 212.

The switch portion 212 includes a plurality of switches to charge and discharge the output terminal X. Here, two switches SW-1 and SW-2 are provided for charging and one switch SW-3 is provided for discharging.

The switches SW-1, SW-2, and SW-3 control connection between the terminal X (BDR 131) and wirings to which potentials VH1, VH2, and VL are supplied, respectively. VH1 and VH2 are high power supply potentials for generating high-level signals, where VH1<VH2. VL is a low power supply potential for generating low-level signals, where VL<VH1. VL may be the ground potential GND.

FIG. 3C is a truth table of the BUF 202. Here, "H" and "L" are used instead of data values 0 and 1. "H" and "L" represent a high-level potential and a low-level potential, respectively. Output values (potential levels) of the logic portion 211 are represented by the on or off states of the switches SW-1, SW-2, and SW-3 in the switch portion 212.

By turning on the switches SW-1 and SW-2, the terminal X can be set at a high level. SW-1 supplies the normal high-level potential VH1 to the terminal X, and SW-2 sets the potential of the terminal X at the potential VH2 that is higher than the normal high-level potential.

The switch SW-3 sets the potential of the terminal X at the low-level potential VL.

<Operation Example of Buffer Circuit BUF>

The operation of the BUF 202 is described with reference to FIG. 3C.

The BUF 202 has a function of setting the signal CDMP at three potential levels: "L", "H(VH1)," and "H(VH2)." The signal CDMP has two high-level potentials. Here, "H(VH1)" corresponds to a normal high level, and "H(VH2)" corresponds to a high level that is higher than the normal high level.

The logic portion 211 is a control portion of the switch portion 212. The logic portion 211 generates a control signal for turning on any one of the switches SW-1, SW-2, and SW-3 provided in the switch portion 212 in accordance with the input signals Din and CDWD from the terminals B1 and B2 and outputs the control signal to the switch portion 212.

If B2 is at "L," SW-3 is turned on regardless of the potential level of B1. In other words, if the signal CDWD is low, the low-level signal CDMP is input to the BL 121.

In the case where B1 is at "L" and B2 is at "H," SW-1 is turned on. In the case where B1 and B2 are at "H," SW-2 is turned on.

In other words, in the case where the signal CDMP for turning on the transistor MP is output to the BL 121, the normal high-level potential VH1 is supplied to the BL 121 when the INL 101 (Din) is at "L," and the potential VH2 that is higher than VH1 is supplied to the BL 121 when the INL 101 (Din) is at "H."

In that case, by turning on the transistor MW, the signal CDMP for turning on the transistor MP is written to the node SN. The potential of the node SN is VH1 when the node A1 (B1) is at "L," and the potential of the node SN is VH2 when the node A1 (B1) is at "H."

A difference between VH2 and VH1 may be equal to or higher than the increase in potential of the node SN by the boosting effect that is caused by supply of the high-level potential VH1 to the node A1.

Thus, when the potential VH1 is supplied to the node A1, configuration data can be written at the potential VH2 that is higher than the potential VH1. Consequently, even when the potential of the node SN is increased by the boosting effect, the potential of the node SN can be increased to a needed potential (here, a potential for turning on the transistor MP).

Then, in the case where the potential of the node A1 is changed from VH1 to VL, the potential of the node SN might be dropped when the boosting effect is remarkable. However, since the potential of the node SN is increased to VH2, a high-level potential (potential that can turn on the transistor MP) can be held in the node SN even when such a potential drop occurs.

Thus, the BUF 202 in the BDR 131 can reduce the data writing errors and retention errors in the PGC 111 due to transition of the potential level of the node A1 and reduces malfunction of the PGC 111. Consequently, the boosting effect can increase the response speed of the CM-SW 110 and achieve stable operation of the PLD 10.

<Circuit Structure Example of Buffer Circuit BUF>

Figures 4A, 4B:
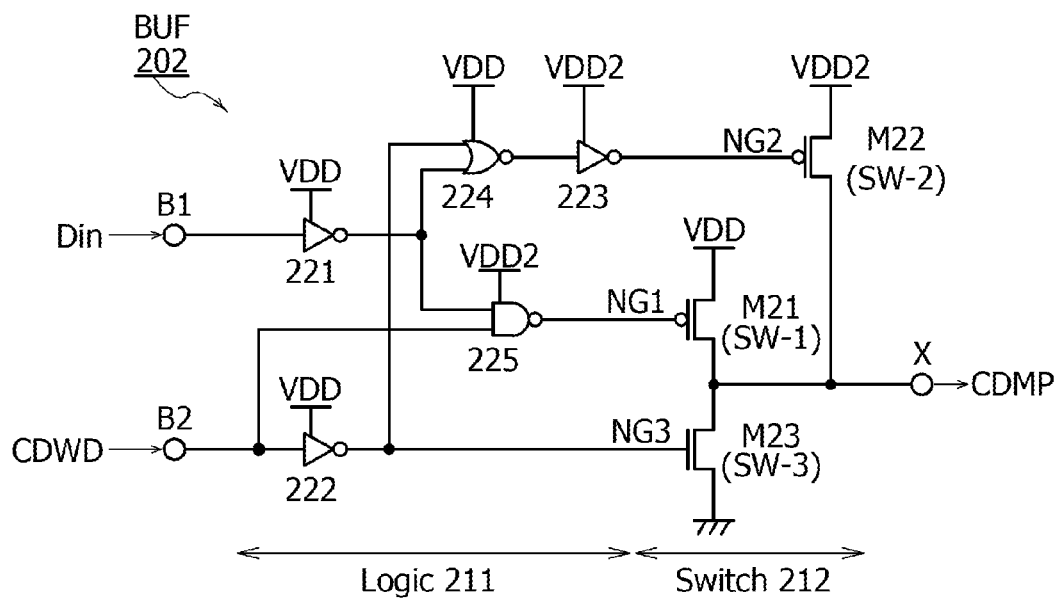
FIG. 4A is a circuit diagram illustrating a structure example of BUF.
FIG. 4B is a truth table of BUF.

FIG. 4A illustrates a specific circuit structure of the BUF 202. FIG. 4B is a truth table of the BUF 202.

The logic portion 211 includes inverters 221 to 223, a NOR gate circuit 224, and a NAND gate circuit 225. The logic portion 211 generates control signals of the switch portion 212 by logical operation of signals input to the terminals B1 and B2.

The switch portion 212 includes transistors M21 to M23. The transistors M21 to M23 correspond to the switches SW-1 to SW-3 in FIG. 3B, and nodes NG1 to NG3 correspond to gates of the transistors M21 to M23.

With regard to the power supply potentials of the BUF 202, the potential VL for setting signals low is the ground potential GND, and the power supply potentials VH1 and VH2 for setting signals high are VDD and VDD2, respectively. Here, a potential that is equal to the power supply potential VDD for setting the potential of the OUTL 102 high is supplied to the BUF 202 as a high power supply potential for generating a normal high-level ("H") signal (see FIG. 2). In FIG. 4B, "H2" represents a high level corresponding to VDD2.

In the logic portion 211, the high power supply potentials of the inverters 221 and 222 and the NOR gate circuit 224 are VDD, and the high power supply potentials of the inverter 223 and the NAND gate circuit 225 are VDD2. Alternatively, the high power supply potentials of the inverter 223 and the NAND gate circuit 225 can be VDD, and a level shifter circuit that converts a potential level can be provided at an output of the NAND gate circuit 225. In such a case, the level shifter circuit has a function of converting VDD into VDD2.

Note that the structures of the logic portion 211 and the switch portion 212 are not limited to those in FIG. 4A. FIG. 4A illustrates a circuit structure example in which SW-1 and SW-2 are p-channel transistors and SW-3 is an n-channel transistor. The circuit structure of the logic portion 211 may be designed in accordance with the structures of the switches SW-1 to SW-3 in the switch portion 212 so that the logical operation in FIG. 3C is executed.

A programmable circuit that includes the circuit (BUF 202) for generating the signal CDMP is not limited to the PGC 111. All the programmable circuits that include the transistor MP and the transistor MW having functions of charging and discharging the gate of the transistor MP and setting the gate of the transistor MP in an electrically floating state, like the PGC 111, can include the circuit (BUF 202) for generating the signal CDMP.

<Example of Method for Driving Switch Circuit CM-SW>

Figure 5:
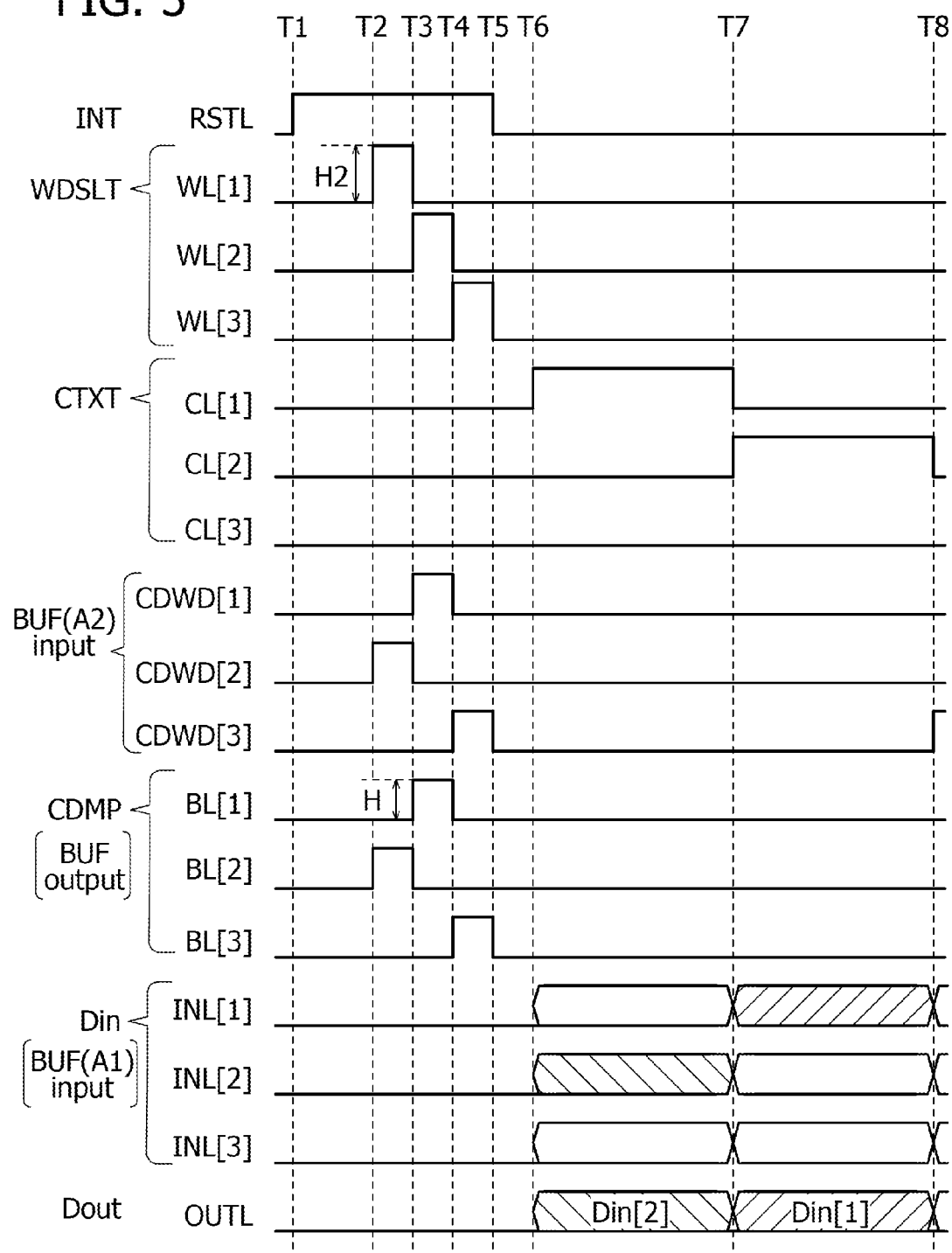
FIG. 5 is a timing chart showing an example of a method for driving CM-SW.

A method for driving the CM-SW 110 is described below with reference to FIG. 5 and FIG. 6. FIG. 5 and FIG. 6 are timing charts showing an example of the method for driving the CM-SW 110, and T1 to T12 each represent time. Here, the example of the method for driving the CM-SW 110 is described in which the PGCs 111 are arranged in three rows and three columns (n and m are each 3) and the BUF 202 in FIG. 4A generates the configuration data signal CDMP. Furthermore, the way of describing potential levels is the same as that of the truth table in FIG. 4B. That is, a high level corresponding to VDD and the high level corresponding to VDD2 are represented as "H" and "H2," respectively.

<T1 to T6: Configuration Mode>

During this period, the LEs 100 connected to the CM-SWs 110 are set in a stop state (non-active state), and configuration processing for writing configuration data to the PGCs 111 in the CM-SWs 110 is performed.

During this period, INLs[1] to [3] are preferably at "L" because high-level CDMP can be generated only by VDD in the BUF 202. Furthermore, since the potential levels of INLs [1] to [3] are not changed, errors in writing configuration data to the CM-SWs 110 can be inhibited.

<T1 to T2: Initialization of Output Signal Line OUTL>

First, the RSTL 103 is set at "H" to turn on the transistor M50 in the RSTC 150 and all the CLs 123 (CLs[1] to [3]) are set at "L" to set the CM-SWs 110 (PGCs[11] to [33]) in a non-active state. Through this operation, the potential of the OUTL 102 is initialized at "L."

In a period from T1 to T2, the RSTL 103 is set at "H" and CLs[1] to [3] are set at "L." Thus, the potential of the LE 100 connected to the OUTL 102 can be prevented from being electrically unstable or an intermediate potential (potential level that is neither "H" nor "L"), so that malfunction of the PLD 10 can be prevented.

Although not illustrated, when WLs[1] to [3] are set at "H" and BLs[1] to [3] are set at "L," the potential levels of the nodes SN in all the CM-SWs 110 can be initialized at "L" at once. The initialization operation of the CM-SWs 110 may be performed, for example, when configuration data of all the PGCs 111 is rewritten.

<T2 to T6: Configuration of Switch Circuit CM-SW>

In a period from T2 to T3, a context[1] is set in the CM-SW 110. Specifically, configuration data for setting the on state is written to any one of PGCs[11] to [13] in a first row and configuration data for setting the off state is written to the rest of PGCs[11] to [13]. Here, the context[1] is data for turning on PGC[12].

By setting WL[1] at a high level, the transistors MW of PGCs[11] to [13] are turned on. Since "H" CDWD and "L" Din are input to BUF[2], BUF[2] outputs "H" CDMP to BL[2]. Since "L" CDWD is input to BUFs[1] and [3], BUFs [1] and [3] output "L" CDMP to BLs[1] and [3].

Thus, "L," "H," and "L" are written to the nodes SN of PGCs[11] to [13], respectively. Then, at T3, WL[1] is set at "L," so that each node SN is set in an electrically floating state and PGCs[11] to [13] retain data.

Note that a potential written to the node SN (capacitor Cs) with respect to the potential of the BL 121 might be decreased by a potential corresponding to the threshold voltage of the transistor MW. In that case, a high power supply potential for generating the high-level signal WDSLT is preferably higher than VDD.

In the case where the transistor MW can be turned on by the "H2" signal WDSLT, VDD2 may be supplied to the WDR 132 as a high power supply potential and the high-level signal WDSLT may be generated from VDD2. In the case where the gate potential of the transistor MW cannot be increased sufficiently to a potential for turning on the transistor MW by "H2" WDSLT, high-level WDSLT may be generated in the WDR 132 from a power supply potential VDD3 that is higher than VDD2. In that case, VDD3 may be supplied to the BUF 202 instead of VDD2. With such a structure, the number of high power supply potentials used in the PLD 10 can be reduced from three (VDD, VDD2, and VDD3) to two (VDD and VDD3).

In FIG. 5 and FIG. 6, the high level of WDSLT is "H2."

In a period from T3 to T4, WL[2] is set at "H" to set the context[2] in the CM-SW 110. In a period from T4 to T5, WL[3] is set at "H" to set the context[3] in the CM-SW 110. Configuration data for defining the contexts[2] and [3] are data for turning on PGCs[21] and [33].

<T6 to T12: User Mode>

After T6, the PLD 10 is in an operation mode. A mode in which the PLD 10 executes processing is also referred to as a "user mode."

In a user mode period, the signal line RSTL is at "L." In a period during which context switch is not executed, output of control signals to WLs[1] to [3] and BLs[1] to [3] is stopped.

In a period from T6 to T7, CL[1] is set at "H" and the context[1] is selected. Since INL[2] is connected to OUTL by PGC[12], Din[2] is output as the data signal Dout.

In a period from T7 to T8, CL[2] is set at "H" and the context[2] is selected. Since INL[1] is connected to OUTL by PGC[21], Din[1] is output as the data signal Dout.

In a period from T8 to T11, CL[3] is set at "H" and the context[3] is selected. Since INL[3] is connected to OUTL by PGC[33], Din[3] is output as the data signal Dout.

<T9 to T10: Context Switch of Switch Circuit CM-SW>

In a period from T9 to T10, the unselected context[1] is switched. The context[1] for update is data for turning on PGC[11] and turning off PGCs[12] and [13]. In addition, "H" Din is input to INL[1].

At T9, WL[1] is set at "H2." Since the "H" signal CDWD and the "H" signal Din are input to BUF[1], BUF[1] outputs the "H2" signal CDMP to BL[1]. BUFs[2] and [3] output the "L" signal CDMP to BLs[2] and [3].

At T10, WL[1] is set at "L," so that switch of the context[1] is completed.

In the period from T9 to T10, even when INL[1] is at "H (VDD)," the potential VDD2 that is higher than the potential of INL[1] is written to the node SN; thus, the potential of the node SN can be increased to a potential that can turn on the transistor MP. In other words, in the user mode, context switch can be performed stably.

In a period from T11 to T12, the "H" signal CDMP is input to CL[1] and the context[1] is selected again. Unlike the time when the context[1] is selected (in the period from T6 to T7), INL[1] is connected to OUTL by PGC[11]; thus, Din[1] is output to OUTL as the data signal Dout.

When the potential of INL[1] is changed from "H" to "L" after T10, the potential of the node SN (gate of the transistor MP) in PGC[11] is dropped by the boosting effect in some cases. However, the potential is increased to "H2" in advance when the context[1] is switched; thus, the transistor MP is kept on in PGC[11] even when such a voltage drop occurs.

Even when the potentials of INLs[2] and [3] are changed from "H" to "L" after the period T10, the potentials of the nodes SN in PGCs[12] and [13] are set at "L" when the context[1] is switched; thus, a voltage drop due to the boosting effect does not occur and the transistors MP in PGCs[12] and [13] are kept off.

In this manner, according to this embodiment, retention errors in configuration data (context) rewritten in the user mode can be inhibited.

As described above, since the switching accuracy and retention accuracy of a context (configuration data) can be increased, context switch can be performed stably even when the PLD operates. Thus, according to this embodiment, it is possible to provide a multi-context PLD that can operate stably.

<Structure Example of Logic Element LE>

Figure 7A:
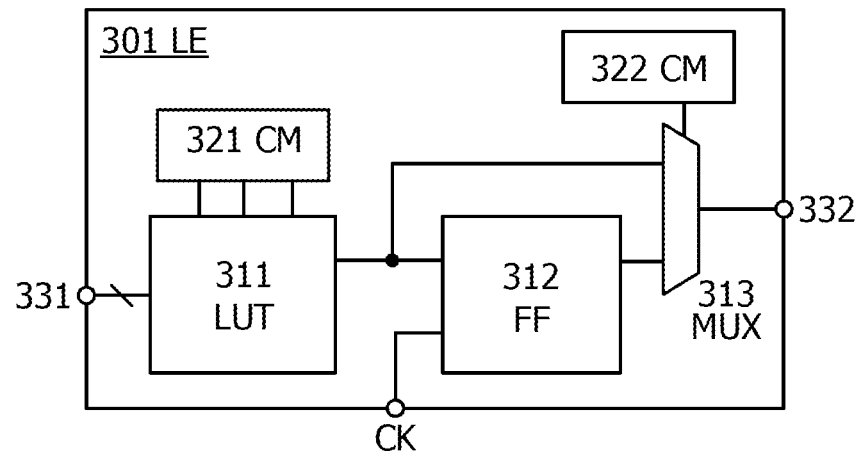
FIGS. 7A and 7B are block diagrams each illustrating a structure example of a logic element LE.
Figure 7B:
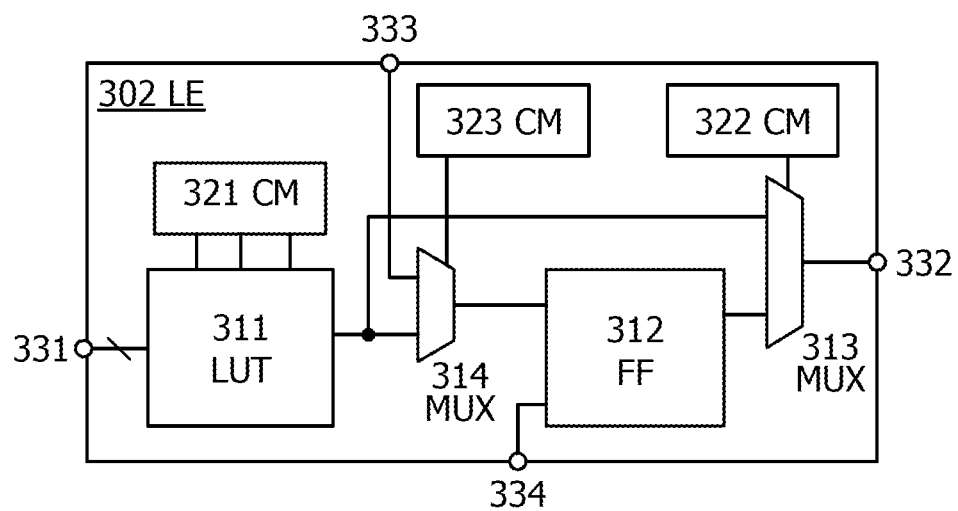

Specific structures of logic elements are described below with reference to FIGS. 7A and 7B. FIGS. 7A and 7B are block diagrams each illustrating a structure example of the logic element LE. LEs 301 and 302 in FIGS. 7A and 7B are each used as the LE 100 in the PLD 10 in FIG. 1.

As illustrated in FIG. 7A, the LE 301 includes a look-up table LUT 311, a flip-flop FF 312, a multiplexer MUX 313, and configuration memories CM 321 and 322. The CM 321 stores configuration data for the LUT 311. The CM 322 stores configuration data for the MUX 313.

Logical operation executed by the LUT 311 varies depending on configuration data stored in the CM 321. When the logical operation executed by the LUT 311 is determined by the configuration data, the LUT 311 generates an output signal corresponding to a plurality of input signals supplied to an input terminal 331 and outputs the output signal to the FF 312. The FF 312 holds the output signal from the LUT 311 and outputs a signal corresponding to the output signal of the LUT 311 in synchronization with a clock signal CK.

Output signals from the LUT 311 and the FF 312 are input to the MUX 313. The MUX 313 has functions of selecting and outputting one of the two output signals in accordance with configuration data stored in the CM 322. An output signal from the MUX 313 is input to an output terminal 332.

The LE 302 in FIG. 7B differs from the LE 301 in FIG. 7A in that an MUX 314 and a CM 323 are provided. The CM 323 stores configuration data for the MUX 314. The LE 302 further includes an input terminal 333 and an output terminal 334. The output terminal 334 of the other LE 302 is connected to the input terminal 333 directly or through the CM-SW 110. The output signal from the FF 312 is supplied to the output terminal 334. The input terminal 333 and the output terminal 334 are used, for example, when a carry chain, a register chain, or the like is formed by connecting adjacent LEs 302 to each other.

The MUX 314 has functions of selecting and outputting one of two input signals in accordance with configuration data stored in the CM 323. The output signal from the LUT 311 is input to one of input terminals of the MUX 314. The input terminal 333 is connected to the other of the input terminals of the MUX 314. An output signal from the MUX 314 is input to the FF 312. The FF 312 holds the output signal from the MUX 314 and outputs an output signal corresponding to the output signal from the LUT 311 in synchronization with the clock signal CK.

Like the CM-SW 110, the CMs 321 to 323 can store a plurality of contexts (configuration data group).

Each of the LEs 301 and 302 may further include a CM for the FF 312. For example, the CM for the FF 312 stores configuration data for defining the structure of the FF 312. By context switch, the function of the FF 312 can be changed to a D flip-flop, a T flip-flop, a JK flip-flop, an RS flip-flop, or the like.

This embodiment can be combined with any of the other embodiments as appropriate.

Embodiment 2

In this embodiment, a PLD device structure is described.
<Structure Example of PLD>

FIG. 8A is a cross-sectional view illustrating a device structure example of the PLD 10. FIG. 8A illustrates a die 600 including the PLD 10. FIG. 8A typically illustrates a cross-sectional structure of the PGC 111. Note that FIG. 8A is not a cross-sectional view of the die 600 taken along a specific section line but a drawing for illustrating a layered structure of the die 600 (device that constitutes the PLD 10).

Here, the die 600 is formed using a bulk single-crystal silicon wafer 601. The bulk single-crystal silicon wafer 601 is used as a semiconductor substrate. Note that a substrate for forming a backplane of the die 600 is not limited to the bulk single-crystal silicon wafer but can be any of a variety of semiconductor substrates. For example, an SOI semiconductor substrate including a single-crystal silicon layer may be used.

In an example of FIG. 8A, the transistors MP and MC are each a Si transistor whose channel formation region is formed in the single-crystal silicon wafer 601, and the transistor MW is an OS transistor. The transistor MW and the capacitor Cs are formed over the transistors MP and MC. With such a layered structure, area overhead due to a retention circuit (MW and Cs) for configuration data in a path gate circuit can be reduced.

The transistors MP and MC can be formed using the single-crystal silicon wafer 601 by a known CMOS process. Here, the single-crystal silicon wafer 601 is an n-type semiconductor substrate, and the transistors MP and MC are formed in a p-well 603 of the single-crystal silicon wafer 601. The transistors MP and MC are electrically isolated from other elements with an element isolation insulating layer 602 formed by local oxidation of silicon (LOCOS). Note that an element isolation means is not limited to the element isolation insulating layer 602, and a known means such as a trench can be used.

N-type impurity regions 605 constitute source and drain regions of the transistors MP and MC. An insulating layer 610 constitutes gate insulating layers of the transistors MP and MC. The insulating layer 610 can be formed, for example, by oxidizing and/or nitriding the single-crystal silicon wafer 601. Conductive layers 621 and 622 over the insulating layer 610 constitute gate electrodes of the transistors MP and MC. The conductive layer 622 constitutes the CL 123 or is connected to a conductive layer that constitutes the CL 123.

An insulating layer 611 is formed to cover the transistors MP and MC. Conductive layers 631 to 633 are formed over the insulating layer 611. Openings that reach the n-type impurity regions 605 and the conductive layer 621 are formed in the insulating layers 610 and 611. Plugs 651 to 653 are formed in these openings.

The plug 651 connects the conductive layer 621 to the conductive layer 631. The plugs 652 and 653 connect the conductive layers 632 and 633 to the n-type impurity regions 605. The conductive layer 632 constitutes the INL 101 or is connected to a conductive layer that constitutes the INL 101. The conductive layer 633 constitutes the OUTL 102 or is connected to a conductive layer that constitutes the OUTL 102.

An insulating layer 612 is formed to cover the insulating layer 611, and a conductive layer 641 is formed over the insulating layer 612. An opening that reaches the conductive layer 631 is formed in the insulating layer 612. A plug 645 is formed in the opening. The plug 654 connects the conductive layer 631 to the conductive layer 641.

An insulating layer 613 is formed to cover the insulating layer 612. The transistor MW and the capacitor Cs are formed over the insulating layer 613.

The transistor MW includes an oxide semiconductor layer (OS layer) 660 and conductive layers 671, 672, and 681. The OS layer 660 constitutes a channel formation region of the transistor MW. The conductive layer 681 constitutes the gate of the transistor MW. The conductive layer 671 constitutes the BL 121 or is connected to a wiring that constitutes the BL 121. The conductive layer 681 constitutes the WL 122 or is connected to a wiring that constitutes the WL 122.

An opening that reaches the conductive layer 641 is formed in the insulating layer 613. The conductive layer 672 is connected to the conductive layer 641 in the opening.

An insulating layer 614 is formed to cover the OS layer 660 and the conductive layers 671 and 672. The insulating layer 614 constitutes a gate insulating layer of the transistor MW.

The capacitor Cs is an MIM capacitor. The capacitor Cs includes the conductive layer 672 and a conductive layer 682 as electrodes and includes the insulating layer 614 as a dielectric substance (insulating film).

An insulating layer 615 that functions as a passivation film is formed to cover the transistor MW and the capacitor Cs. An insulating layer 616 is formed to cover the insulating layer 615. A conductive layer 691 that constitutes an extraction terminal is formed over the insulating layer 616. The conductive layer 691 is connected to the conductive layer 682.

Each of the insulating layers 611 to 616 can be formed using one insulating film or two or more insulating films. Examples of the insulating film used for each of the insulating layers 611 to 616 include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film. These insulating films can be formed by sputtering, CVD, MBE, ALD, or PLD. As a film used for each of the insulating layers 611 to 616, a resin film of polyimide, acrylic, or the like can be formed.

In this specification, an oxynitride refers to a substance that includes more oxygen than nitrogen, and a nitride oxide refers to a substance that includes more nitrogen than oxygen.

Each of the conductive layers 621, 622, 631, 632, 633, 641, 671, 672, 681, 682, and 691 and the plugs 651 to 654 can be formed using one conductive film or two or more conductive films. Such a conductive film can be a metal film containing aluminum, chromium, copper, silver, gold, platinum, tantalum, nickel, titanium, molybdenum, tungsten, hafnium, vanadium, niobium, manganese, magnesium, zirconium, beryllium, or the like. Such a conductive film can be an alloy film containing any of these metals as a component, a compound film containing any of these metals as a component, or a polycrystalline silicon film containing an impurity element such as phosphorus, or the like.

In the die 600, there is no particular limitation on the structures of the transistors MP, MC, and MW included in the PLD 10. FIG. 8A illustrates an example in which the transistors MP, MC, and MW each have a top-gate structure.

For example, in the case where the transistor MW has a dual-gate structure, a conductive layer that functions as a back gate of the transistor MW may be formed together with the conductive layer 641 to overlap the OS layer 660 over the insulating layer 612. In that case, the conductive layer may be connected to the conductive layer 681 (gate) or may be electrically isolated from the conductive layer 681.

As illustrated in FIG. 8B, the transistor MW may further include an OS layer 661. Also in FIG. 8B, the OS layer 660 includes a channel formation region.

To form the transistor MW in FIG. 8B, after the conductive layers 671 and 672 are formed, one oxide semiconductor film or two or more oxide semiconductor films used for the OS layer 661, an insulating film used for the insulating layer 614, and a conductive film used for the conductive layers 681 and 682 are stacked. Then, by etching this stacked film with the use of a resist mask for etching the conductive film, the OS layer 661, the insulating layer 614, and the conductive layer 681 are formed. In the capacitor Cs, the insulating layer 614 in a region that is not covered with the conductive layer 682 is removed.

<OS Transistor and Oxide Semiconductor Film>

As described above, when the transistor MW is an OS transistor with extremely low off-state current, data retention characteristics of the PGC 111 can be improved and refresh operation for retaining data in the PGC 111 becomes unnecessary. It is preferable that the off-state current of the transistor MW be as low as possible.

Thus, in the case where the transistor MW is an OS transistor, the channel formation region of the transistor MW is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is lower than $1 \times 10^{17}/cm^3$. The carrier density is preferably lower than $1 \times 10^{15}/cm^3$, more preferably lower than $1 \times 10^{13}/cm^3$.

By forming the channel formation region using a purified OS, the normalized off-state current of the OS transistor can be as low as several yoctoamperes per micrometer to several zeptoamperes per micrometer at room temperature.

In the oxide semiconductor layer, hydrogen, nitrogen, carbon, silicon, and metal elements that are not main components are impurities. For example, hydrogen and nitrogen form donor levels to increase the carrier density. Silicon forms impurity levels in the oxide semiconductor layer. The impurity level becomes a trap, which might degrade the electrical characteristics of the OS transistor. It is preferable to reduce the concentration of the impurities in the oxide semiconductor layer and at an interface with another layer.

To make the oxide semiconductor layer intrinsic or substantially intrinsic, the oxide semiconductor layer is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor layer. The purified OS has any of the following impurity concentration levels.

For example, in the case where the impurity includes silicon, the concentration of silicon is lower than $1\times10^{19}$ atoms/cm$^3$, preferably lower than $5\times10^{18}$ atoms/cm$^3$, more preferably lower than $1\times10^{18}$ atoms/cm$^3$.

For example, in the case where the impurity includes hydrogen, the concentration of hydrogen is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

For example, in the case where the impurity includes nitrogen, the concentration of nitrogen is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In the case where the oxide semiconductor layer including crystals contains silicon or carbon at high concentration, the crystallinity of the oxide semiconductor layer might be lowered. In order not to lower the crystallinity of the oxide semiconductor layer, for example, the concentration of silicon is set lower than $1\times10^{19}$ atoms/cm$^3$, preferably lower than $5\times10^{18}$ atoms/cm$^3$, more preferably lower than $1\times10^{18}$ atoms/cm$^3$. For example, the concentration of carbon is set lower than $1\times10^{19}$ atoms/cm$^3$, preferably lower than $5\times10^{18}$ atoms/cm$^3$, more preferably lower than $1\times10^{18}$ atoms/cm$^3$.

As the oxide semiconductor used for the OS transistor, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide means an oxide containing In, Ga, and Zn, and there is no limitation on the ratio of In, Ga, and Zn. The In—Ga—Zn-based oxide may contain a metal element other than In, Ga, and Zn. An oxide semiconductor layer having an appropriate composition may be formed in accordance with needed electrical characteristics (e.g., mobility and threshold voltage).

For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above composition is preferably used. In this specification, the atomic ratio of the oxide semiconductor film varies within a range of ±20% as an error.

For example, the oxide semiconductor film can be formed by sputtering.

For example, it is preferable to use an In—Ga—Zn-based oxide target with an atomic ratio of In:Ga:Zn=1:1:1, 5:5:6, 4:2:3, 3:1:2, 1:1:2, 2:1:3, 1:3:2, 1:3:4, 1:6:4, or 3:1:4 as an In—Ga—Zn-based oxide deposition target. When an In—Ga—Zn-based oxide semiconductor film is deposited using such a target, a crystal part is formed in the oxide semiconductor film easily. The filling factor of such a target is preferably higher than or equal to 90%, more preferably higher than or equal to 95%. With a target having a high filling factor, a dense oxide semiconductor film can be deposited.

For example, it is preferable to use an In—Zn-based oxide target with an atomic ratio of In:Zn=50:1 to 1:2 (a molar ratio of In$_2$O$_3$:ZnO=25:1 to 1:4) as an In—Zn-based oxide deposition target. The atomic ratio of In:Zn is preferably 15:1 to 1.5:1 (the molar ratio of In$_2$O$_3$:ZnO=15:2 to 3:4). For example, in an In—Zn-based oxide deposition target with an atomic ratio of In:Zn:O=X:Y:Z, the relation Z>1.5X+Y is preferably satisfied. The mobility of an In—Zn-based oxide film can be increased by keeping the ratio of Zn within the above range.

<Structure of Oxide Semiconductor Film>

The structure of the oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

<CAAC-OS Film>

The CAAC-OS film is described in detail below. The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflected by a surface over which the CAAC-OS film is formed (also referred to as a formation surface) or a top surface of the CAAC-OS film, and is provided in parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

In an electron diffraction pattern of the CAAC-OS film, spots (bright spots) indicating alignment are observed. For example, spots are observed in an electron diffraction pattern (also referred to as a nanobeam electron diffraction pattern) of the top surface of the CAAC-OS film that is obtained using an electron beam with a diameter of, for example, larger than or equal to 1 nm and smaller than or equal to 30 nm.

From the results of the high-resolution cross-sectional TEM image and the high-resolution planar TEM image, alignment is found in the crystal parts in the CAAC-OS film.

In an electron diffraction pattern of the CAAC-OS film, spots (bright spots) indicating alignment are observed. For example, spots are observed in an electron diffraction pattern of the top surface of the CAAC-OS film that is obtained using an electron beam with a diameter of, for example, larger than or equal to 1 nm and smaller than or equal to 30 nm. In the case where the oxide semiconductor film has a plurality of structures, the structures can be analyzed using nanobeam electron diffraction in some cases.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of larger than or equal to 2500 $nm^2$, larger than or equal to 5 $\mu m^2$, or larger than or equal to 1000 $\mu m^2$ is observed in some cases in the high-resolution planar TEM image.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

In addition, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Furthermore, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

In an OS transistor including the CAAC-OS film, changes in electrical characteristics of the transistor due to irradiation with visible light or ultraviolet light are small. Thus, the transistor has high reliability.

In the description of a crystal structure, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

For example, a CAAC-OS film is deposited by sputtering with a polycrystalline metal oxide target. When ions collide with the target, a crystal region included in the target might be separated from the target along the a-b plane, and a sputtered particle having a plane parallel to the a-b plane (flat-plate-like or pellet-like sputtered particle) might be separated from the target. In that case, the flat-plate-like or pellet-like sputtered particle reaches a substrate while maintaining its crystal state, so that the CAAC-OS film can be deposited.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a treatment chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, when the flat-plate-like or pellet-like sputtered particle reaches the substrate, migration occurs on the substrate, so that a flat plane of the sputtered particle is attached to the substrate. For example, the substrate heating temperature during the deposition is 100 to 740° C., preferably 200 to 500° C.

Furthermore, it is possible to reduce plasma damage during the deposition by increasing the proportion of oxygen in the deposition gas and optimizing power. For example, the proportion of oxygen in the deposition gas is higher than or equal to 30 vol %, preferably 100 vol %.

<Microcrystalline Semiconductor Film>

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in the nc-OS film in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

<Amorphous Oxide Semiconductor Film>

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found. When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Each of the OS layers 660 and 661 of the transistor MW can be formed using one oxide semiconductor film or two or more oxide semiconductor films. Each of the OS layers 660 and 661 may be a stacked film including two or more films of an amorphous oxide semiconductor film, a microcrystalline oxide semiconductor film, and a CAAC-OS film, for example. In the case where the oxide semiconductor film has a plurality of structures, the structures can be analyzed using nanobeam electron diffraction in some cases.

For example, in the transistor MW in FIG. 8A, the OS layer 660 has a two-layer structure. A lower layer and an upper layer of an oxide semiconductor film may be formed using oxides including different constituent elements. For example, the lower layer is formed using an In—Zn-based oxide film and the upper layer is formed using an In—Ga—Zn-based oxide film. Alternatively, each of the lower layer and the upper layer can be formed using an In—Ga—Zn-based oxide film.

For example, in the case where each of the lower layer and the upper layer is formed using an In—Ga—Zn-based oxide film, one of the lower layer and the upper layer can be formed using an oxide film with an atomic ratio of In:Ga:Zn=1:1:1, 5:5:6, or 3:1:2, and the other of the lower layer and the upper layer can be formed using an oxide film with an atomic ratio of In:Ga:Zn=1:3:2, 1:3:4, 1:3:6, 1:6:4, or 1:9:6.

In FIG. 8B, when the OS layer 660 has a two-layer structure and the OS layer 661 has a single-layer structure, the transistor MW may be formed using an oxide semiconductor film with a three-layer structure. Also in this case, all or part of the three layers may be formed using oxide semiconductor films including different constituent elements, or the three layers may be formed using oxide semiconductor films including the same constituent element.

For example, in the case where each of the OS layers 660 and 661 is formed using an In—Ga—Zn-based oxide film, each of the upper layer of the OS layer 660 and the OS layer 661 can be formed using an oxide film with an atomic ratio of In:Ga:Zn=1:3:2, 1:3:4, 1:3:6, 1:6:4, or 1:9:6, and the lower layer of the OS layer 660 can be formed using an oxide film with an atomic ratio of In:Ga:Zn=1:1:1, 5:5:6, or 3:1:2.

This embodiment can be combined with any of the other embodiments as appropriate.

Embodiment 3

The PLD 10 can be used as processors of electronic devices in a variety of fields, such as digital signal processors, software-defined radio systems, avionic systems (electronic devices used in aircraft, such as communication systems, navigation systems, autopilot systems, and flight management systems), medical image processors, voice recognition devices, encryption devices, emulators for mechanical systems, and radio telescopes in radio astronomy.

Examples of electronic devices including the PLD 10 are display devices, personal computers (PC), tablet computers, and image reproducing devices provided with recording media (devices that read image data of recording media such as digital versatile discs (DVDs) and have displays for displaying images). Other examples are cellular phones, smartphones, game machines (including portable game machines), portable information terminals, e-book readers, cameras such as video cameras and digital still cameras, goggle-type displays (head mounted displays), navigation systems, audio reproducing devices (e.g., car audio systems and digital audio players), scanners, copiers, facsimiles, printers, and multifunction printers. FIGS. 9A to 9F illustrate specific examples of these electronic devices.

Figure 9A:
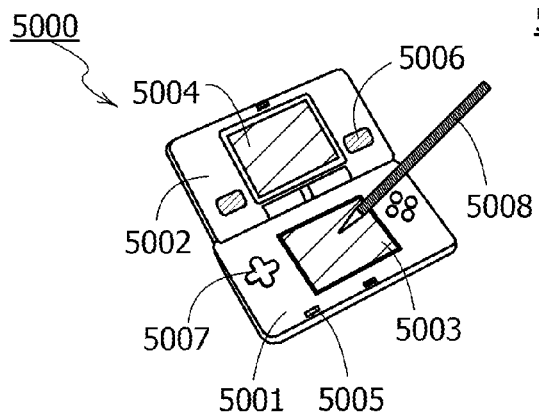
FIGS. 9A to 9F are external views each illustrating a structure example of an electronic device.

FIG. 9A is an external view illustrating a structure example of a portable game machine. A portable game machine 5000 includes a housing 5001, a housing 5002, a display portion 5003, a display portion 5004, a microphone 5005, a speaker 5006, an operation key 5007, a stylus 5008, and the like.

Figure 9B:
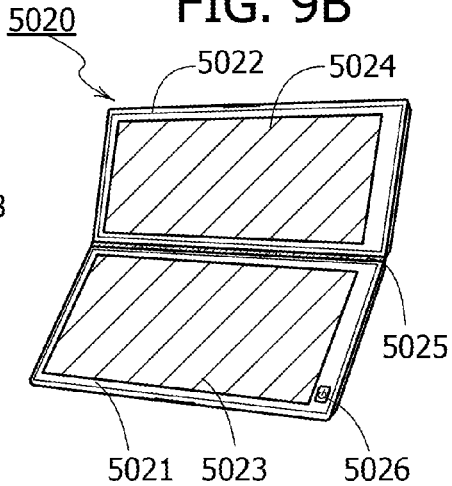

FIG. 9B illustrates a portable information terminal. A portable information terminal 5020 includes a housing 5021, a housing 5022, a display portion 5023, a display portion 5024, a joint 5025, an operation key 5026, and the like. The display portion 5023 is provided in the housing 5021, and the display portion 5024 is provided in the housing 5022. The housings 5021 and 5022 are connected to each other with the joint 5025, and an angle between the housings 5021 and 5022 can be changed with the joint 5025. An image on the display portion 5023 may be switched depending on the angle between the housings 5021 and 5022 at the joint 5025. A display device with a position input function may be used as either one or both the display portions 5023 and 5024. The position input function can be added by providing a touch panel in a display device. Alternatively, the position input function can be added by providing a photoelectric conversion element called a photosensor in a pixel portion of a display device.

Figure 9C:
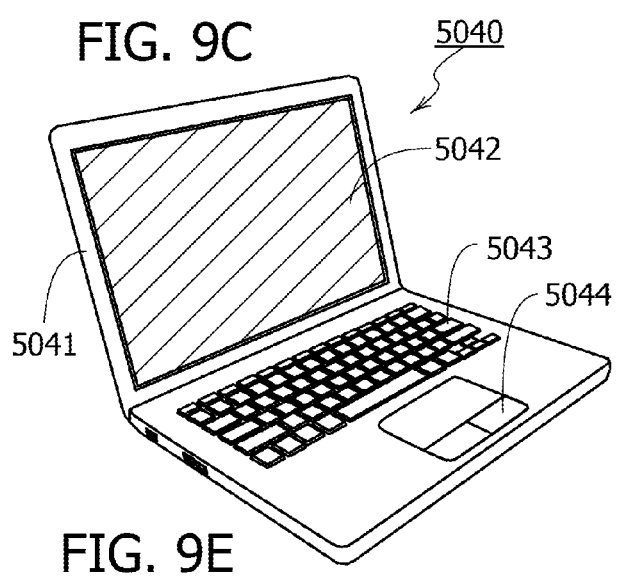

FIG. 9C is an external view illustrating a structure example of a laptop. A laptop 5040 includes a housing 5041, a display portion 5042, a keyboard 5043, a pointing device 5044, and the like.

Figure 9D:
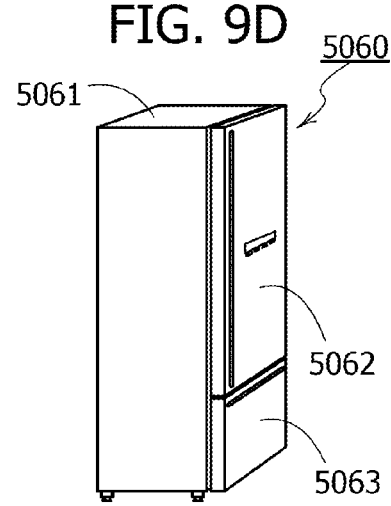

FIG. 9D is an external view illustrating a structure example of an electric refrigerator-freezer. An electric refrigerator-freezer 5060 includes a housing 5061, a refrigerator door 5062, a freezer door 5063, and the like.

Figure 9E:
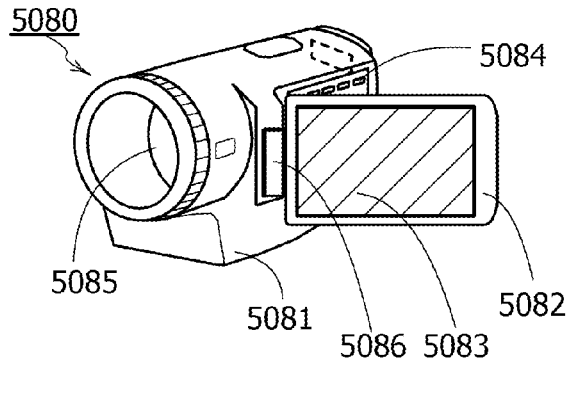

FIG. 9E is an external view illustrating a structure example of a video camera. A video camera 5080 includes a housing 5081, a housing 5082, a display portion 5083, operation keys 5084, a lens 5085, a joint 5086, and the like. The operation keys 5084 and the lens 5085 are provided in the housing 5081, and the display portion 5083 is provided in the housing 5082. The housings 5081 and 5082 are connected to each other with the joint 5086, and an angle between the housings 5081 and 5082 can be changed with the joint 5086. The direction of an image on the display portion 5083 may be changed and display and non-display of an image may be switched depending on the angle between the housings 5081 and 5082.

Figure 9F:
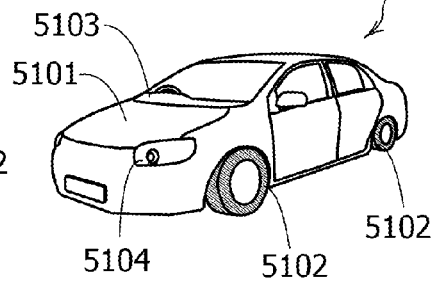

FIG. 9F is an external view illustrating a structure example of a motor vehicle. A motor vehicle 5100 includes a car body 5101, wheels 5102, a dashboard 5103, lights 5104, and the like.

This embodiment can be combined with any of the other embodiments as appropriate.

This application is based on Japanese Patent Application serial No. 2013-141214 filed with Japan Patent Office on Jul. 5, 2013, the entire contents of which are hereby incorporated by reference.

What is claimed is:

1. A semiconductor device comprising:
   a path gate circuit comprising:
      a first transistor between an input signal line and an output signal line, one of a source and a drain of the first transistor being electrically connected to the input signal line; and
      a second transistor between a bit line and a gate of the first transistor; and
   a circuit being electrically connected to the gate of the first transistor through the second transistor and the bit line,
   wherein the circuit is configured to supply a first signal at a first high level when a potential of the input signal line is at a low level, and
   wherein the circuit is configured to supply a second signal at a second high level when the potential of the input signal line is at a high level, the second high level being higher than the first high level.

2. The semiconductor device according to claim 1,
   wherein the other of the source and the drain of the first transistor is electrically connected to the output signal line,
   wherein one of a source and a drain of the second transistor is electrically connected to the bit line,
   wherein the other of the source and the drain of the second transistor is electrically connected to the gate of the first transistor, and
   wherein a gate of the second transistor is electrically connected to a word line.

3. The semiconductor device according to claim 1,
   wherein the path gate circuit further comprises a third transistor,
   wherein the other of the source and the drain of the first transistor is electrically connected to one of a source and a drain of the third transistor,
   wherein one of a source and a drain of the second transistor is electrically connected to the bit line,
   wherein the other of the source and the drain of the second transistor is electrically connected to the gate of the first transistor,
   wherein a gate of the second transistor is electrically connected to a word line,
   wherein the other of the source and the drain of the third transistor is electrically connected to the output signal line, and
   wherein a gate of the third transistor is electrically connected to a signal line.

4. The semiconductor device according to claim 1,
   wherein the path gate circuit further comprises a capacitor, and
   wherein one terminal of the capacitor is electrically connected to the gate of the first transistor.

5. The semiconductor device according to claim 1, further comprising:
   a first logic element electrically connected to the input signal line; and
   a second logic element electrically connected to the output signal line.

6. The semiconductor device according to claim 1,
   wherein each of the first signal and the second signal corresponds to configuration data.

7. The semiconductor device according to claim 1,
   wherein the circuit comprises:
      a first switch between the bit line and a first potential supply line configured to supply a first potential at the first high level;
      a second switch between the bit line and a second potential supply line configured to supply a second potential at the second high level; and
      a logic portion configured to control an on or off state of each of the first switch and the second switch in accordance with the potential of the input signal line.

8. A semiconductor device comprising:
   a path gate circuit comprising:
      a first transistor between an input signal line and an output signal line, one of a source and a drain of the first transistor being electrically connected to the input signal line; and
      a second transistor between a bit line and a gate of the first transistor; and
   a circuit being electrically connected to the gate of the first transistor through the second transistor and the bit line,
   wherein the circuit is configured to supply a first signal at a first high level when a potential of the input signal line is at a low level,
   wherein the circuit is configured to supply a second signal at a second high level when the potential of the input signal line is at a high level, the second high level being higher than the first high level, and
   wherein a channel formation region of the second transistor comprises an oxide semiconductor layer.

9. The semiconductor device according to claim 8,
   wherein the other of the source and the drain of the first transistor is electrically connected to the output signal line,
   wherein one of a source and a drain of the second transistor is electrically connected to the bit line,
   wherein the other of the source and the drain of the second transistor is electrically connected to the gate of the first transistor, and
   wherein a gate of the second transistor is electrically connected to a word line.

10. The semiconductor device according to claim 8,
wherein the path gate circuit further comprises a third transistor,
wherein the other of the source and the drain of the first transistor is electrically connected to one of a source and a drain of the third transistor,
wherein one of a source and a drain of the second transistor is electrically connected to the bit line,
wherein the other of the source and the drain of the second transistor is electrically connected to the gate of the first transistor,
wherein a gate of the second transistor is electrically connected to a word line,
wherein the other of the source and the drain of the third transistor is electrically connected to the output signal line, and
wherein a gate of the third transistor is electrically connected to a signal line.

11. The semiconductor device according to claim 8,
wherein the path gate circuit further comprises a capacitor, and
wherein one terminal of the capacitor is electrically connected to the gate of the first transistor.

12. The semiconductor device according to claim 8, further comprising:
a first logic element electrically connected to the input signal line; and
a second logic element electrically connected to the output signal line.

13. The semiconductor device according to claim 8,
wherein each of the first signal and the second signal corresponds to configuration data.

14. The semiconductor device according to claim 8,
wherein the circuit comprises:
a first switch between the bit line and a first potential supply line configured to supply a first potential at the first high level;
a second switch between the bit line and a second potential supply line configured to supply a second potential at the second high level; and
a logic portion configured to control an on or off state of each of the first switch and the second switch in accordance with the potential of the input signal line.

15. The semiconductor device according to claim 8,
wherein a channel formation region of the first transistor comprises silicon.

16. The semiconductor device according to claim 8,
wherein a channel formation region of the first transistor comprises silicon, and
wherein the second transistor is provided over the first transistor.

* * * * *